United States Patent
Ueno et al.

(10) Patent No.: US 8,920,565 B2
(45) Date of Patent: Dec. 30, 2014

(54) METALORGANIC CHEMICAL VAPOR DEPOSITION REACTOR

(75) Inventors: Masaki Ueno, Itami (JP); Eiryo Takasuka, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 1190 days.

(21) Appl. No.: 12/270,867

(22) Filed: Nov. 14, 2008

(65) Prior Publication Data

US 2009/0126635 A1    May 21, 2009

(30) Foreign Application Priority Data

Nov. 21, 2007    (JP) ................. 2007-301882

(51) Int. Cl.
| | |
|---|---|
| C23C 16/00 | (2006.01) |
| C23C 16/50 | (2006.01) |
| C23F 1/00 | (2006.01) |
| H01L 21/306 | (2006.01) |
| C23C 16/455 | (2006.01) |
| C30B 25/08 | (2006.01) |
| C23C 16/30 | (2006.01) |

(52) U.S. Cl.
CPC ..... *C23C 16/45585* (2013.01); *C23C 16/45504* (2013.01); *C30B 25/08* (2013.01); *C23C 16/303* (2013.01)
USPC ................ 118/725; 156/345.33; 156/345.52

(58) Field of Classification Search
USPC .............. 118/715, 728–732; 156/345.33, 156/345.51–345.55
See application file for complete search history.

(56) References Cited

U.S. PATENT DOCUMENTS

| | | | | |
|---|---|---|---|---|
| 3,750,620 | A * | 8/1973 | Eversteijn et al. | 118/725 |
| 3,816,166 | A | 6/1974 | Eversteijn et al. | |
| 4,991,540 | A * | 2/1991 | Jurgensen et al. | 118/715 |
| 6,214,116 | B1 * | 4/2001 | Shin | 118/640 |
| 6,709,703 | B2 * | 3/2004 | Shibata et al. | 427/255.34 |

FOREIGN PATENT DOCUMENTS

| | | |
|---|---|---|
| EP | 0559326 A1 | 9/1993 |
| JP | H02-291113 A | 11/1990 |

(Continued)

OTHER PUBLICATIONS

Aaron Krowne. "monotonic" (version 2). PlanetMath.org. Freely available at http://planetmath.org/Monotonic.html. Last accessed Aug. 25, 2012.*

(Continued)

*Primary Examiner* — Parviz Hassanzadeh
*Assistant Examiner* — Tiffany Nuckols
(74) *Attorney, Agent, or Firm* — Ostrolenk Faber LLP (57) ABSTRACT

Affords MOCVD reactors with which, while deposited films are uniformized in thickness, film deposition efficiency can be improved. An MOCVD reactor (1) is furnished with a susceptor (5) and a duct (11). The susceptor (5) has a carrying surface for heating and carrying substrates (20). The duct (11) is for conducting reaction gas (G) to the substrates (20). The susceptor (5) is rotatable with the carrying surface fronting on the duct (11) interior. The duct (11) has channels (11b) and (11c), which merge on the duct end upstream of Point A4. The height of the duct (11) running along the reaction gas (G) flow direction monotonically diminishes heading toward the duct downstream end from Point P1 to Point P2, stays constant from Point P2 to Point P3, and monotonically diminishes heading downstream from Point P3. Point P1 lies upstream of Point A4, while Point P3 lies on the susceptor (5).

9 Claims, 11 Drawing Sheets

(56) References Cited

FOREIGN PATENT DOCUMENTS

| | | |
|---|---|---|
| JP | H02-291114 A | 11/1990 |
| JP | H06-216030 A | 8/1994 |
| JP | 2002-261021 A | 9/2002 |
| JP | 2004-063555 A | 2/2004 |
| JP | 2005-272987 A | 10/2005 |
| JP | 2006-287256 A | 10/2006 |

OTHER PUBLICATIONS

English Machine Translation of JP2006287256A. Performed and printed on Feb. 19, 2014 from http://www4.ipdl.inpit.go.jp/Tokujitu/PAJdetail.ipdl?N0000=60&N0120=01&N2001=2&N3001=2002-359203.*

* cited by examiner

METALORGANIC CHEMICAL VAPOR DEPOSITION REACTOR

BACKGROUND OF THE INVENTION

1. Technical Field

The present invention relates to metalorganic chemical vapor deposition reactors, and more specifically, to metalorganic chemical vapor deposition reactors for producing nitride semiconductor films.

2. Description of the Related Art

Metalorganic chemical vapor deposition (MOCVD), one technique representative of vapor-phase deposition, is a method of vaporizing, for example, a Group-III organometallic compound, and, on the surface of a substrate, thermally decomposing the vaporized Group-III compound and reacting the decomposition products with a Group-V gas to deposit a film on the substrate. Because film thickness and composition can be controlled with MOCVD, and because the technique excels in terms of productivity, it is widely employed as a film-growth technology in the manufacture of semiconductor devices.

MOCVD reactors employed in MOCVD are provided with a chamber, with a susceptor disposed in the chamber, and with a channel for feeding reaction gases to the surface of substrates. In the MOCVD reactors, film deposition is carried out by placing substrates on the susceptor to heat them to an appropriate temperature, and by flowing organometallic gases through the channel to the surface of the substrates. In the film deposition, uniformizing deposited films in thickness demands from the MOCVD reactors that the reaction gas flow uniformly along the substrate surfaces. In order to flow the reaction gases uniformly along the substrate surfaces in MOCVD reactors, various channel forms have been proposed.

As a conventional MOCVD reactor, for example, Japanese Unexamined Pat. App. Pub. No. H02-291113 (Patent Document 1) discloses a vapor-phase growth system having a conduit for introducing a reaction gas to space over a substrate. The conduit has: a sample-loading room internally housing a susceptor; a constricted part whose cross-sectional form is flattened, extending along the widthwise direction of the substrate, and being short in height-wise direction of the substrate, for ejecting reaction gas over the substrate from along the substrate sideways; and guide parts positioned over the substrate, in the constricted part at intervals approximately equal to the height-wise width, or at intervals that narrow heading toward the downstream end of the reaction gas, the guide parts covering the substrates evenly from above and guiding the reaction gas along the substrate surface. The susceptor is anchored in the sample-loading room, and carries the substrate at the downstream end of the reaction-gas flow.

Furthermore, for example, Japanese Unexamined Pat. App. Pub. No. H06-216030 (Patent Document 2) discloses a compound semiconductor vapor-phase growth system having a flow channel for introducing a reaction gas onto a substrate. The flow channel is tapered such that the height-wise width narrows from the upstream end of the flow channel gradually toward the downstream end of the flow channel. A susceptor is anchored under where the flow channel is tapered.

Moreover, Japanese Unexamined Pat. App. Pub. No. H2-291114 (Patent Document 3) and Japanese Unexamined Pat. App. Pub. No. H2-291113 (Patent Document 1) disclose a vapor-phase growth system provided with a rotating susceptor for carrying a substrate, and with a linear line for introducing a reaction gas to the substrate. The liner line monotonically diminishes in height over the reaction gas conduit.

Improving film-deposition efficiency is being demanded from MOCVD reactors. Scaling up the susceptor makes it possible to heat many substrates at once, and to grow films onto substrates of large diametric span, leading to the improvement of film-deposition efficiency. Scaling up the susceptor, however, enlarges the distance between the upstream and downstream ends of the susceptor, leading to a significant difference between reaction gas conditions (for example, concentration and temperature of the reaction gas) on the upstream and downstream ends of the susceptor. As a result, the thickness of the deposited films proves to be non-uniform. For this reason, to date, improving film-deposition efficiency while the films to be deposited are uniformized in thickness has not been realized.

BRIEF SUMMARY OF THE INVENTION

Accordingly, an object of the present invention is to make available MOCVD reactors with which, while films to be deposited are uniformized in thickness, efficiency of depositing the films can be improved.

A separate object of the present invention is to make available MOCVD reactors with which, while films to be deposited are improved in planarity, they can be uniformized in thickness.

AN MOCVD reactor of the present invention is a metalorganic chemical vapor deposition reactor for depositing films onto substrates, employing a reaction gas, and provided with a heating member and a duct. The heating member has a carrying surface for heating, and for carrying, the substrates. The duct is for introducing the reaction gas to the substrates. The heating member is rotatable with the carrying surface facing toward the duct interior. The duct has a first channel and a second channel, and the first and second channels join together on the side upstream from the upstream end of the carrying surface. The duct height along the direction of the reaction gas flow monotonically diminishes downstream from a first point to a second point, stays constant from the second point to a third point, and monotonically diminishes downstream from the third point. The first point lies on the side upstream from the upstream end of a location on the carrying surface in which the substrates are carried, and the third point lies on the heating member.

With the MOCVD reactor of the present invention, film-deposition rate on the side downstream from the third point can be fastened. Fastening the film-deposition rate enables bringing relationship between carrying-surface position along the reaction gas flow direction and film-deposition rate close to linear proportion. As a result, rotating the heating member makes it possible to uniformize in thickness the films deposited onto the substrates. Furthermore, no necessity to equalize reaction gas conditions for reaction respectively on the upstream and downstream ends of the heating member with each other leads to upsizing of the heating member, enabling enhancing film-deposition efficiency.

Furthermore, the duct monotonically decreases in height upstream of the upstream edge of the locus on the carrying surface of where the substrates are carried, which promotes mixing of gas passing through the first channel and gas passing through the second channel on the upstream edge of the substrate placement locus. As a result, the deposition rate at the upstream end of the carrying surface increases, and consequently linearity of the growth rate in the reaction-gas flow direction is enhanced. Therefore, while the deposited films are improved in planarity, they can be uniformized in thickness.

In the MOCVD reactor of the present invention, the second point preferably lies upstream of the upstream edge of the substrate placement locus. Therefore, at least from the upstream edge of the substrate placement locus to the third point, the duct height is held constant, which enables making the reaction gas flow on the substrates closer to a laminar flow.

In the MOCVD reactor of the present invention, the second point preferably lies upstream of the upstream edge of the carrying surface. Therefore, at least from the upstream edge of the carrying surface to the third point in the heating member, the duct height is held constant, which enables making the reaction gas flow closer to a laminar flow before the reaction gas reaches the carrying surface.

In the MOCVD reactor of the present invention, the first point preferably lies downstream from where the first and second channels merge. Therefore, after the gas that has passed through the first channel and the gas that has passes through the second channel join together, the mixing of the gas that has passed through the first channel and the gas that has passed through the second channel can be promoted.

In the MOCVD reactor of the present invention, it is preferable that the duct height monotonically diminishes downstream from the third point to a fourth point. The fourth point lies on the downstream end of the substrate placement locus, or downstream from the downstream edge of the substrates. Therefore, relationship between substrate placement location along the direction of the reaction gas flow and film-deposition rate can be made linear.

In the MOCVD reactor of the present invention, the duct preferably has a first sloping portion formed between the first and second points, and a second sloping portion formed downstream from the third point. The fist and second sloping portions slope with respect to the reaction gas flow direction. Therefore, the duct height decreases at a constant rate, which enables keeping disturbance of the reaction gas flow under control.

According to the MOCVD reactor of the present invention, while films to be deposited are uniformed in thickness, efficiency of depositing the films can be enhanced. Furthermore, while the films to be deposited are improved in planarity, the films can be uniformed in thickness.

From the following detailed description in conjunction with the accompanying drawings, the foregoing and other objects, features, aspects and advantages of the present invention will become readily apparent to those skilled in the art.

DETAILED DESCRIPTION OF THE INVENTION

Hereinafter, referring to the figures, embodiments of the present invention will be described.

Embodiment 1

Figure 1:
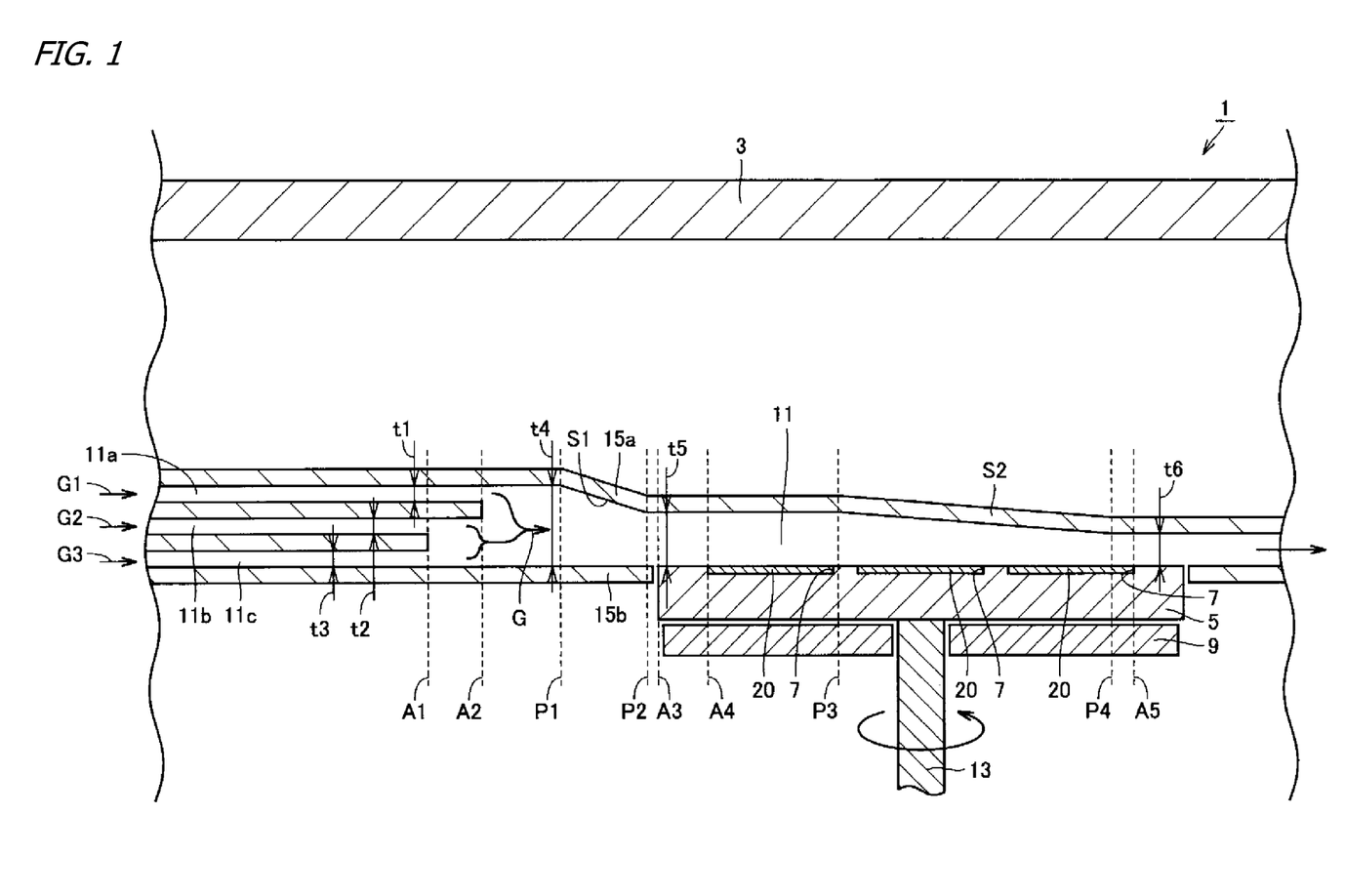
FIG. 1 is a sectional view illustrating the configuration of an MOCVD reactor in Embodiment 1 of the present invention.
Figure 2:
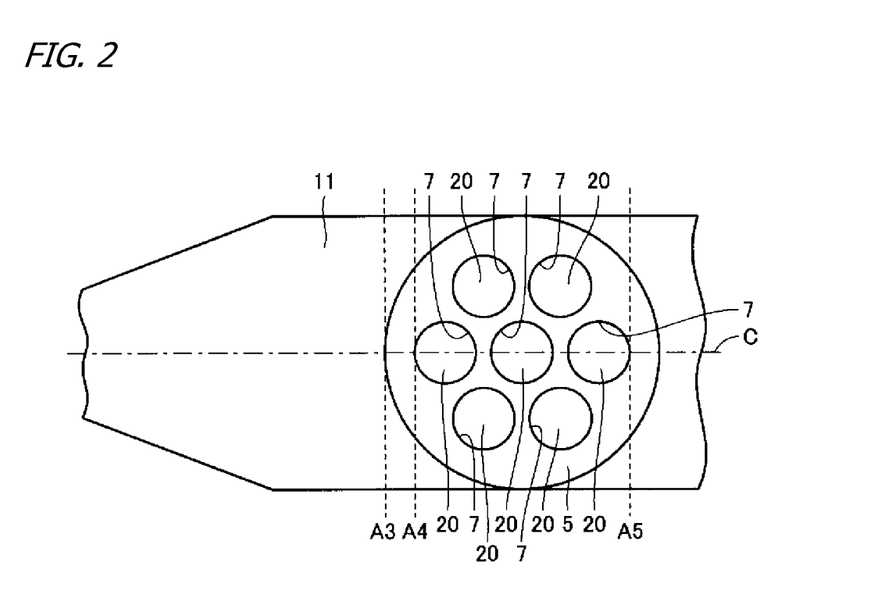
FIG. 2 is an overhead, fragmentary view of the FIG. 1 susceptor and its vicinity.

FIG. 1 is a cross-sectional view illustrating the configuration of an MOCVD reactor in Embodiment 1 of the present invention. FIG. 2 is an overhead, fragmentary view from FIG. 1 of the susceptor and its vicinity. Referring to FIGS. 1 and 2, an MOCVD reactor 1 of the present embodiment is furnished with: a chamber 3; a susceptor 5 as a heating member; a heater 9; and a duct 11. The susceptor 5, heater 9, and duct 11 are disposed inside the chamber 3. The duct 11 stretches widthwise in the middle of FIG. 1, and a carrying surface (in FIG. 1, the top side) of the susceptor 5 fronts on the interior of the duct 11.

The susceptor 5 is discoid in form, and is disposed over the heater 9, which likewise is discoid in form. To the underside of the susceptor 5, a rotating shaft 13 is mounted, which makes the susceptor 5 rotatable with the carrying surface fronting on the duct 11 interior. A plurality of indentations 7 that are of circular form viewed overhead are formed in the carrying surface of the susceptor 5. Each of substrates 20 are placed in respective indentations 7, where the substrates 20 are heated. With reference to FIG. 2 in particular, seven indentations 7 are formed in the carrying surface of the susceptor 5, and circular substrates 20 are each placed respectively in these indentations 7.

The duct 11 extends horizontally with respect to the carrying surface of the susceptor 5, and has the cross-sectional form of a rectangle when viewed along a plane perpendicular to the direction of reaction gas flow (the direction from the left to the right in FIG. 1). Furthermore, the duct 11 is a lateral trilaminar flow system, and has three channels 11a to 11c on at its upstream end (on the left in FIG. 1). Channels 11b (first channel) and 11c (second channel) merge at Point A1, while Channel 11a, and Channels 11b and 11c merge at Point A2. Points A1 and A2 are located upstream of Point A3, which is the upstream edge, seen in the direction in which the reaction gas G flows (the direction heading from the left side to the right side in FIG. 1), of the carrying surface of the susceptor 5. Channels 11a to 11c have respective heights t1 to t3. Furthermore, the height t4 of the duct 11 from Point A2 to Point P1 (Point P1 will be described later) preferably satisfies the relationship of $t4 \geq t1+t2+t3$.

In the MOCVD reactor 1, a plurality of substrates 20 are placed on the carrying surface of the susceptor 5, and the susceptor 5 is heated by the heater 9 and is rotated. Subsequently, Gases G1 to G3 constituting reaction gases are introduced respectively through the channels 11a to 11c. The reaction gases flow to the right in FIG. 1. In an instance, for example, in which III-V nitride semiconductor films are deposited, the following gases could be utilized: as Gas G1, a purge gas such as hydrogen ($H_2$) gas or nitrogen ($N_2$) gas; as Gas G2, a mixture of a Group-III element-containing organometallic gas such as trimethyl gallium (TMG), trimethyl indium (TMI), or trimethylaluminum (TMA), and a carrier gas such as $H_2$ gas or $N_2$ gas; and as Gas G3, a mixture of a Group-V element-containing gas such as ammonia ($NH_3$) gas, and a carrier gas such as $H_2$ gas or $N_2$ gas. When Gases G1 to G3 are each introduced respectively into Channels 11a to 11c, mixing of Gases G2 and G3 begins at Point A1, and their mixing together with Gas G1 begins at Point A2, to constitute the reaction gas G. Then, the reaction gas G is introduced over the susceptor 5, spreading parallel to its carrying surface, and is heated by the susceptor 5. By being heated, the organometallic gas contained in the reaction gas G decomposes into an intermediate reactant, which reacts with an intermediate reactant into which ammonia likewise has decomposed by being heated, to form a nitride semiconductor. As a result, a nitride semiconductor layer is deposited onto the surface of the substrates 20.

Figure 3:
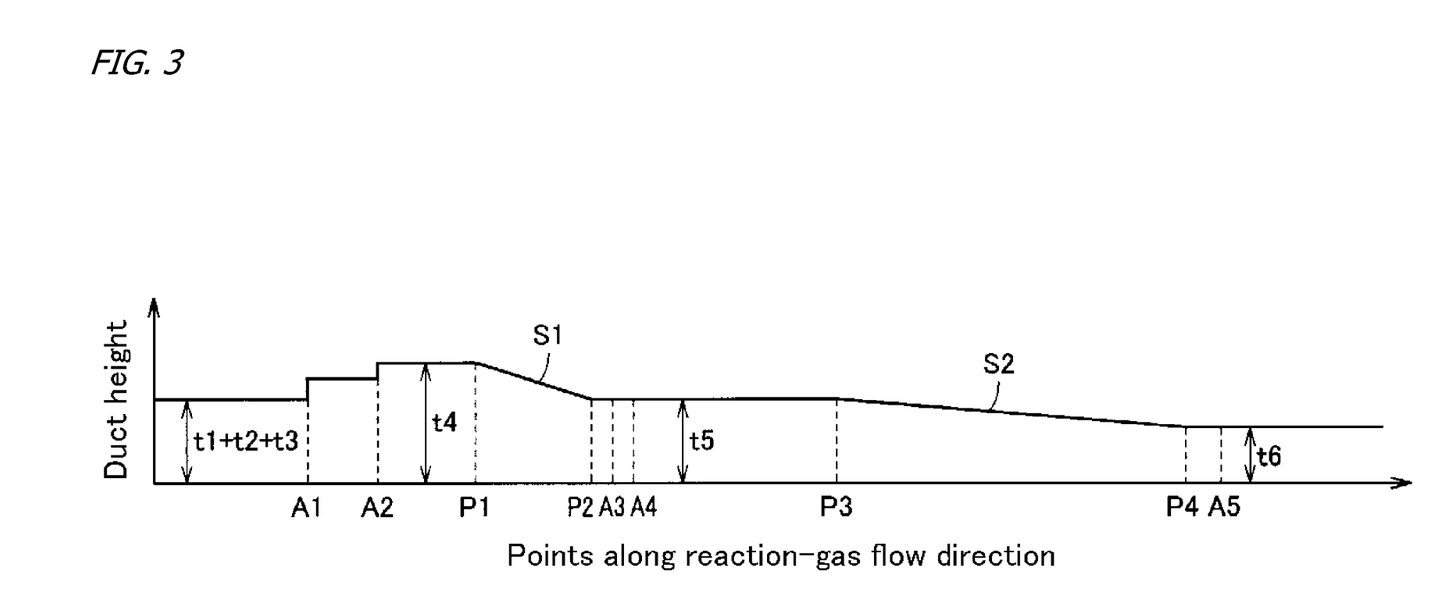
FIG. 3 is a chart diagramming duct height in relation to points along the direction of reaction gas flow, in Embodiment 1 of the present invention.

In the MOCVD reactor 1, sloping portions S1 and S2 are formed in an upper portion 15a of the duct 11, with the sloping portions S1 and S2 declining in the direction of the reaction gas flow. The duct 11 varies in height along the direction of reaction gas flow. FIG. 3 is a chart diagramming duct height in relation to given points along the direction of reaction gas flow, in Embodiment 1 of the present invention.

With reference to FIGS. 1 and 3, the upstream edge of the locations on the carrying face of the susceptor 5 where substrates 20 are carried is designated as Point A4, and the downstream edge of the locations on the carrying face of the susceptor 5 where the substrates 20 are carried is designated as Point A5. The height of the duct 11, going in the reaction gas G flow direction, as attendant on the confluence of Channels 11b and 11c makes a discontinuous increase at Point A1, and as attendant on the confluence of Channel 11a and Channels 11b and 11c makes a discontinuous increase at Point A2. The duct then has a constant height of t4 from Point A2 to Point P1 (first point). Continuing from there, the duct monotonically diminishes (linearly diminishes) heading from Point P1 downstream to Point P2 (second point); this section is sloping portion S1. Next, the duct has a constant height of t5 from Point P2 to Point P3 (third point) with Points A3 and A4 intervening. The duct then monotonically diminishes (linearly diminishes) heading from Point P3 downstream to Point P4; this section is sloping portion S2. Thereafter, the duct has a constant height of t6 in a region including Point A5, on the end downstream of Point P4.

In the MOCVD reactor 1, Point P1 is equivalent to Point A1, or else lies downstream of Point A1. Furthermore, Points P1 and P2 lie upstream of Point A3. Point P3 lines on the susceptor 5 (in other words, between Point A3 and the downstream edge of the carrying surface of the susceptor 5). Point P4 lies upstream of Point A5.

It should be understood that the locations of Points P1 to P4 in the present embodiment are illustrative; in an MOCVD reactor of the present invention, it should at least be the case that Point P1 lies upstream of Point A4, and that Point P3 lies on the susceptor 5. This means that Point P2 may lie downstream of Point A3 but upstream of Point A4, or that Points P1 and P2 may both lie downstream of Point A3 but upstream of Point A4.

Figure 4:
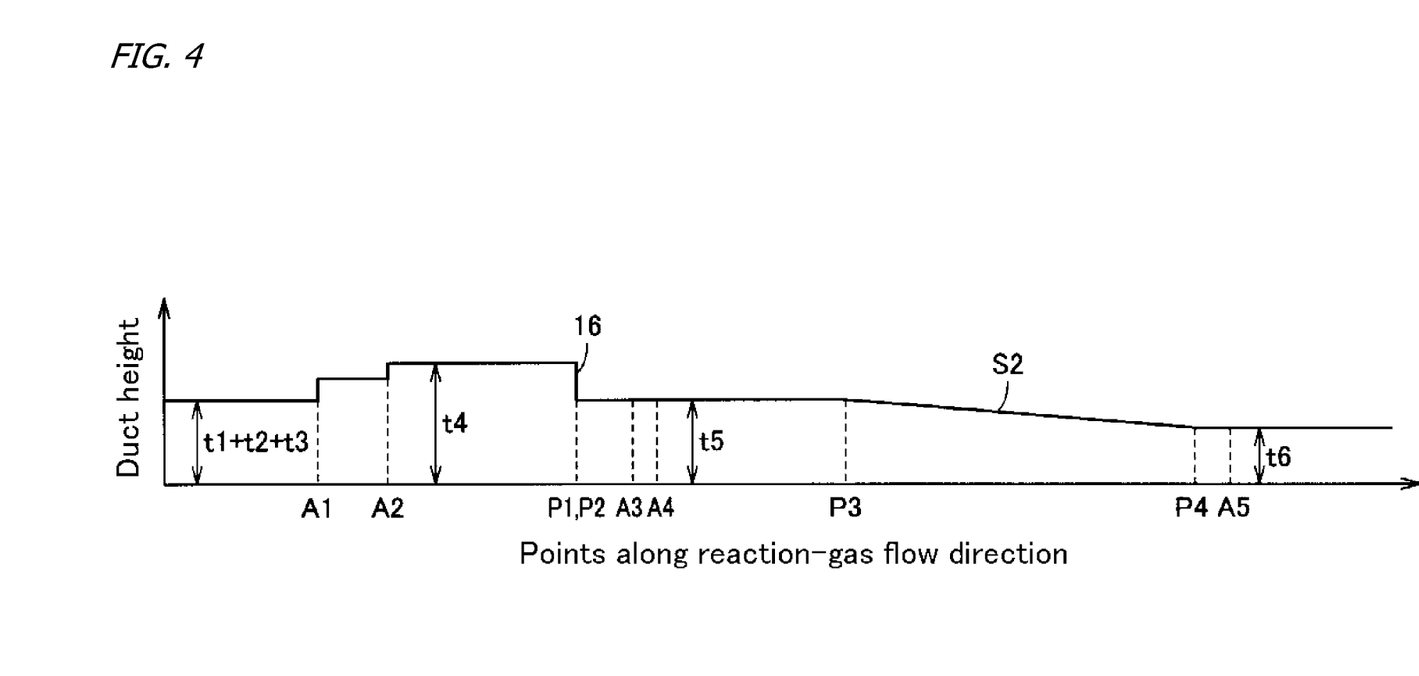
FIG. 4 is a chart diagramming a variant example of duct height in relation to points along the direction of reaction gas flow, in Embodiment 1 of the present invention.

Furthermore, although in the present embodiment the sloping portion S1 is formed in the upper portion 15a of the duct 11 to monotonically diminish the height of the duct 11 from Point P1 to Point P2, in another implementation of the present invention, as illustrated in FIG. 4 for example, a step 16 may be formed in the upper portion 15a of the duct 11 to have height of the duct 11 decrease discontinuously from height t4 to height t5. In this instance, Point P1 and Point P2 are in the same location. Further options include forming the sloping portions S1 and S2 in the lower portion 15b rather than in the upper portion 15a of the duct 11, or forming the step 16 in the lower portion 15b rather than in the upper portion 15a of the duct 11.

Figure 5:
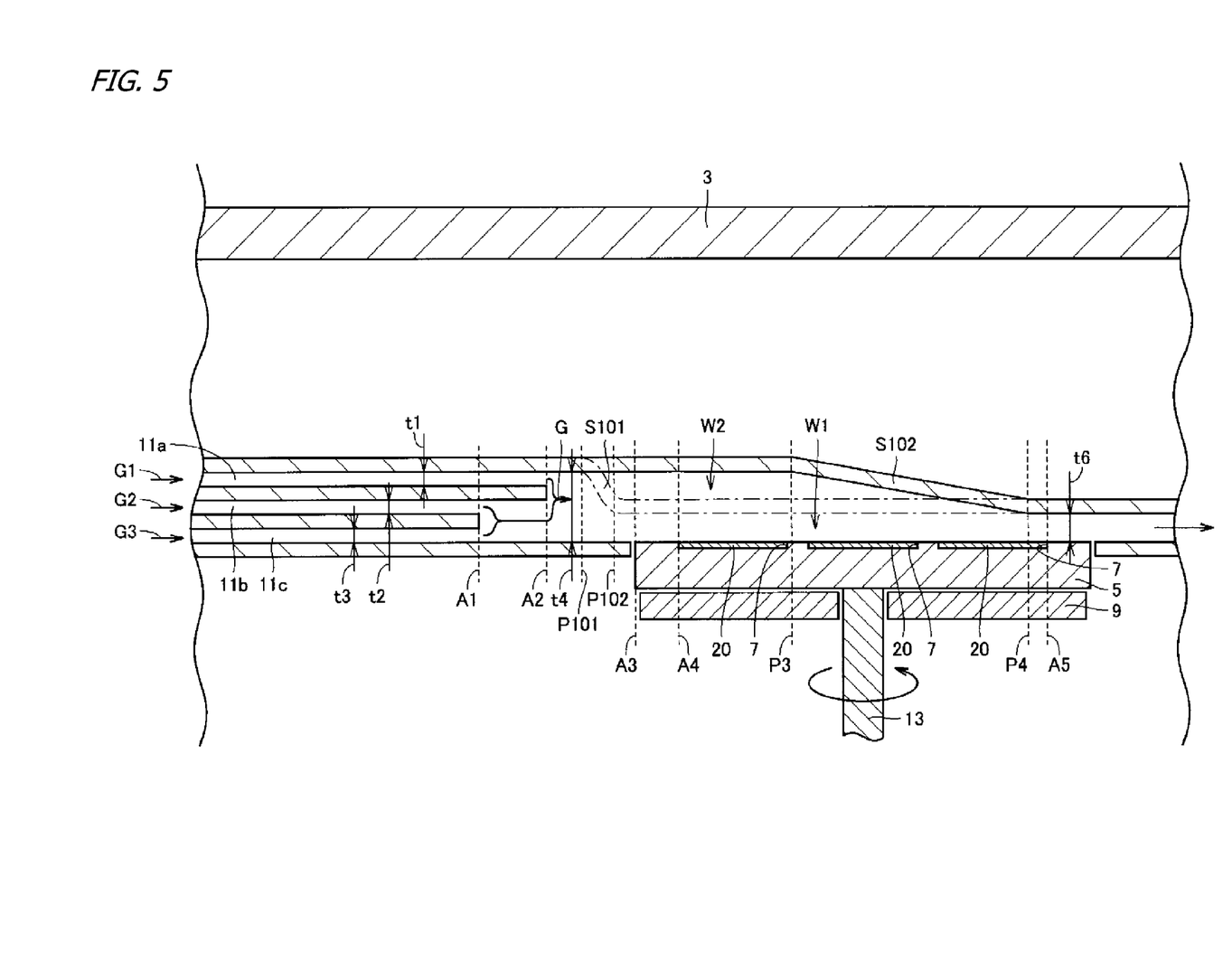
FIG. 5 is a sectional view illustrating the configuration of an MOCVD reactor in Comparative Examples 1 and 2.

Next, the performance of the MOCVD reactor in the present embodiment will be described. FIG. 5 is a sectional view illustrating the configuration of an MOCVD reactor in Comparative Examples 1 and 2. With reference to FIG. 5, initially the inventors in the present application prepared an MOCVD reactor (Comparative Example 1) having a duct W1 as indicated by the dotted-dashed (phantom) lines. In an upper part of the duct W1, a sloping portion S101 is formed. The height of the duct W1, along the direction of the flow of the reaction gas G monotonically diminishes (linearly diminishes) heading downstream from Point P101 to Point P102, and then stays constant at a height of t6 in the region downstream of Point P102. Herein, apart from that difference, the MOCVD configuration is the same as the configuration of the MOCVD reactor illustrated in FIG. 1.

Figure 6:
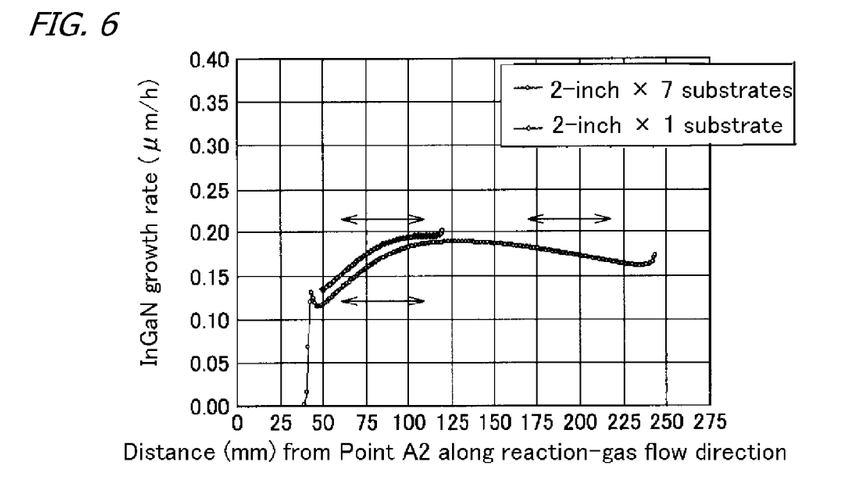
FIG. 6 is a graph plotting the relationship between the distance from Point A2 along the direction of reaction gas flow, and InGaN growth rate, in an implementation in which the MOCVD reactor of Comparative Example 1 was employed to deposit an InGaN film without the susceptor being rotated.

This MOCVD reactor was employed to deposit an InGaN layer, being a semiconductor nitride layer, onto the surface of substrates, without rotating the susceptor 5. Then the relationship between InGaN-growth rate and the distance from Point A2 along the direction of the reaction gas G flow and was investigated. The results are set forth in FIG. 6. It should be understood that the results in FIG. 6 are results taken along the centerline (line C in FIG. 2) in the susceptor widthwise direction and that the ranges indicated by the arrows in FIG. 6 are locations on the carrying surface of the susceptor 5 where the substrates 20 are set. Also, for comparison, results in an implementation in which a single 2-inch substrate 20 was set on, in a reactor in which the size of the duct W1 and susceptor 5 had been similarly scaled down to allow carrying a single 2-inch substrate, are additionally presented in the graph.

Referring to FIG. 6, in the susceptor carrying seven substrates the InGaN growth rate jumps from 0 at a point approximately 40 mm from Point A2 (that is, the susceptor starting point), exhibits a maximum at a point approximately 85 mm from the upstream edge, and decreases moderately thereafter.

Meanwhile, the InGaN growth rate in the implementation in which a single substrate was set on increases almost monotonically.

In the FIG. 6 results, that the InGaN growth rate makes a great leap from 0 at the susceptor starting point would be due to the reaction gas having to be heated on the susceptor in order for the reaction between the Group-III and Group-V precursors to begin. And that a maximum value is exhibited is because a boundary layer develops as the source-material dispersion progresses over the course of the lower flow, and therefore the concentration gradient after once increasing moderates. Furthermore, from the results in FIG. 6 it is evident that in the situation in which the susceptor is not rotated, attendant on the scaling-up of the susceptor, the reaction conditions differ significantly between the upstream end and the downstream end of the reaction gas flow.

Next, with the MOCVD reactor of Comparative Example 1, the inventors in the present application deposited an InGaN layer onto the surface of substrates while rotating the susceptor. However, the number of the substrates set on the susceptor was put at six, with the substrates each being placed so that their centers would be in a position separated by 53 mm from the center of the susceptor. The relationship between the InGaN growth rate and the distance from the susceptor center was then investigated. Also, for comparison, results in an implementation in which a single 2-inch substrate was set on, in a reactor of a size allowing a single 2-inch substrate to be carried, are additionally presented. The results are set forth in FIG. 7. Further, spreads in the InGaN growth-rate distribution across the substrates are set forth in Table I.

TABLE I

|  | With 6 substrates set on | With 1 substrate set on |
|---|---|---|
| InGaN growth-rate distribution spread | ±4.3% | ±1.8% |

Figure 7:
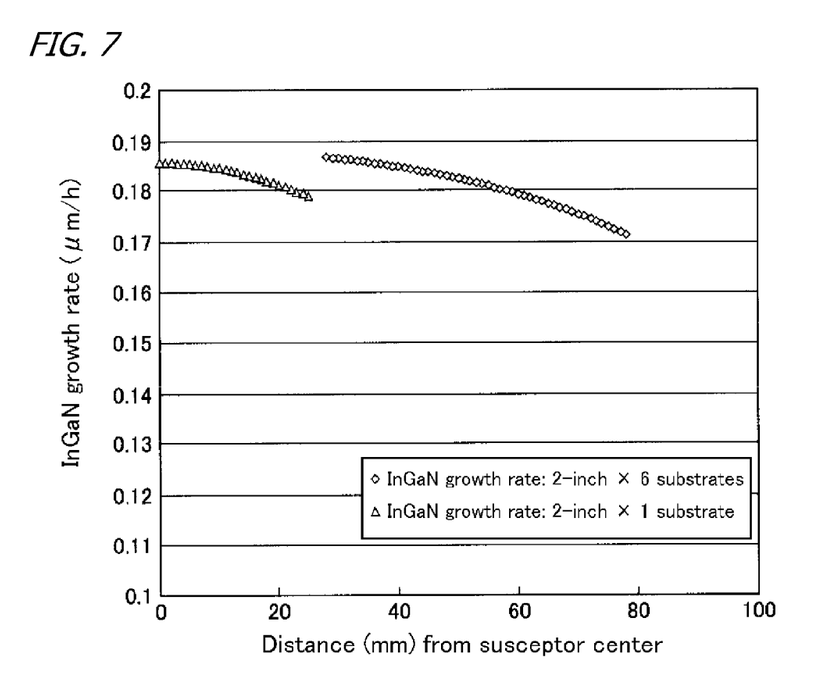
FIG. 7 is a graph plotting the relationship between distance from the center of the susceptor, and InGaN growth rate, in an implementation in which the MOCVD reactor of Comparative Example 1 was employed to deposit an InGaN film while the susceptor was rotated.

As will be understood from FIG. 7 and Table I, rotating the susceptor averages the InGaN growth-rate distribution, changing it for the better. Yet the InGaN growth-rate distribution in the implementation in which six substrates were carried has a width of ±4.3%, versus a width of ±1.8% for the InGaN growth-rate distribution in the implementation in which a single substrate was carried. From this difference it is evident that attendant on scaling up of the susceptor, even also in implementations in which the susceptor is rotated, the thickness of the deposited films is not uniform. It is also evident that in either case—in the implementation in which a single substrate was carried, as well as the implementation in which six substrates were carried—the InGaN growth rate distribution decreased at the susceptor outer-diametric side.

Herein, in situations in which the susceptor is rotated to deposit films onto substrates, making it so that the relationship between the deposition rate and the carrying-surface location running in the reaction-gas flow direction is linear (a proportional relationship) makes it possible to deposit uniform films along the substrates. That is, in situations in which the susceptor is rotated, it is not necessary to make the growth rate on the susceptor upstream end consistent with that on the downstream end.

With this understanding the inventors in the present application next prepared an MOCVD reactor (Comparative Example 2) having a duct W2 as illustrated in FIG. 5, in order to improve the InGaN growth rate in FIG. 6 on the downstream end of the susceptor to bring the relationship between deposition rate and carrying-surface position along the direction of reaction gas flow close to linear. In the duct W2, a sloping portion S102 similar to that in the MOCVD reactor 1 illustrated in FIG. 1 is formed. That is, the height of the duct W2 along the direction of the flow of the reaction gas G monotonically diminishes (linearly diminishes) heading downstream from Point P3 on the susceptor 5 to Point P4, and then stays constant at a height of t6 in the region downstream of Point P4. In Comparative Example 2, the point where the InGaN growth rate in FIG. 6 becomes maximum (the 125 mm position) was made Point P3. Subsequently, using the respective MOCVD reactors of Comparative Examples 1 and 2, the susceptor 5 was rotated and meanwhile an InGaN layer was deposited onto the surface of each of the six substrates 20 placed on the susceptor 5. The spread in the InGaN growth-rate distribution across the substrates 20 were investigated. The results are set forth in Table II.

TABLE II

|  | Comp. Ex. 1 | Comp. Ex. 2 |
|---|---|---|
| InGaN growth-rate distribution spread | ±4.3% | ±0.4% |

Referring to Table II, whereas the InGaN growth-rate distribution in Comparative Example 1 is ±4.3%, in Comparative Example 2 the InGaN growth-rate distribution is ±0.4%, meaning that the distribution spread decreases. From these facts it is evident that monotonically diminishing the duct height heading downstream from a given point on the susceptor makes it possible to uniformize the thickness of the deposited films even where the susceptor is scaled up to produce films on a plurality of substrates simultaneously.

Herein, referring to FIG. 5, in the MOCVD reactor, Point P4, which is the point where the monotonic decrease in duct height ends, preferably lies on same position as Point A5, or downstream of Point A5. The relationship between the reaction-gas reaction rate and the substrate placement location along the direction of reaction gas flow can thereby be made linear. This will be explained below.

The present inventors studied influence of Point P4 on deposition rate. Specifically, the MOCVD reactors, in FIG. 5, in which Point P4 was brought to the side upstream from Point A4 (Comparative Example 2), and in which Point P4 was brought to the same position as Point A4 (Comparative Example 3) were prepared. In addition, for comparison, the MOCVD reactor of Comparative Example 1 was prepared. Next, each of the MOCVD reactors of Comparative Examples 1 through 3 was employed to deposit an InGaN layer onto the surface of each of six substrates 20 carried on the susceptor 5, without rotating the susceptor 5. And then, relationship between interval from the center of the susceptor 5 and InGaN growth rate was checked. The results are set forth in FIG. 8. It should be understood that the results in FIG. 8 are the results along the central line (line C in FIG. 2) in the susceptor widthwise direction, and the ranges represented with the arrows in FIG. 8 are the location on the carrying surface of the susceptor in which substrates are placed.

Figure 8:
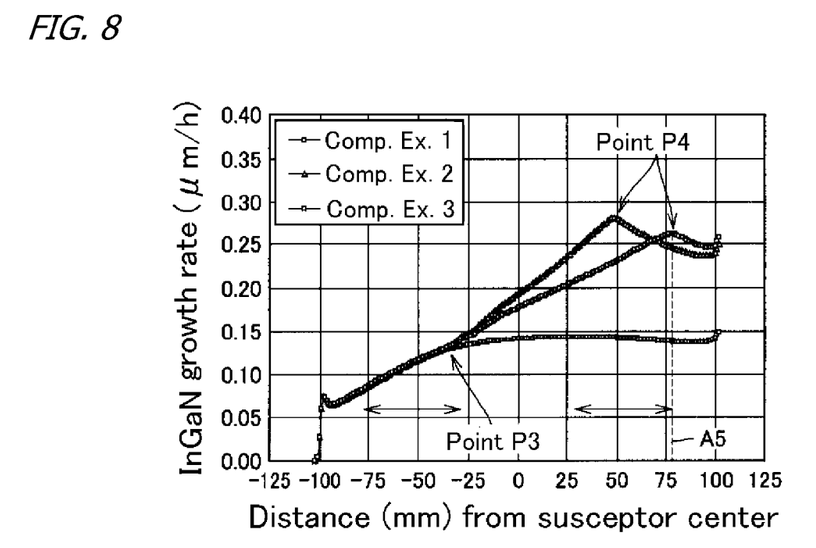
FIG. 8 is a graph plotting the relationship between distance from the center of the susceptor and InGaN growth rate, in implementations in which the MOCVD reactors of Comparative Examples 1 through 3 were each employed to deposit an InGaN film.

Referring to FIG. 8, in Comparative Examples 2 and 3, InGaN growth rate almost linearly increases with shifting from the upstream end of, to the downstream end of, the susceptor. In Comparative Example 2, however, linear form is broken at Point P4, while in Comparative Example 3, linear form is maintained to the downstream end (point A5) of the location in which substrates are placed. From these results, it is apparent that if Point P4 lies at the same position as Point A5, or on the side downstream from Point A5, the relationship between substrate placement location along the direction of reaction gas flow and reaction rate of reaction gas can be brought to linear proportion.

Subsequently, in the MOCVD reactor in Comparative Example 2, the inventors of the present invention varied flow rate of $NH_3$ gas contained in the gas G3 to deposit an InGaN layer onto the surfaces of substrates. Specifically, a GaN layer was deposited by 30 nm in thickness onto sapphire substrates heated to 475° C., and then the temperature of the substrates was raised to 1,150° C. to further deposit the GaN layer by 1.5 μm in thickness. After that, the substrate temperature was dropped to 785° C. to deposit an InGaN layer by 50 nm in thickness under the following conditions—pressure: 100 kPa, $NH_3$ flow rate: 20 slm (standard liters per minute) or 30 slm, $N_2$ flow rate: 49.5 slm, TMG flow rate: 35 μmol/min to 56 μmol/min, TMI flow rate: 28 μmol/min to 45 μmol/min, ratio of Group-V gas to Group-III gas: approximately 13,000. In the depositions of the GaN and InGaN layers, the substrates were placed with their orientation flats (OF) being directed toward the outer periphery of the susceptor. After the InGaN layer was formed, morphologies on the surface of the InGaN layer were evaluated under an atomic force microscope (AFM). Furthermore, in the InGaN layer, In fraction distribution and InGaN layer thickness distribution were measured by X-ray diffraction.

Figure 9A:
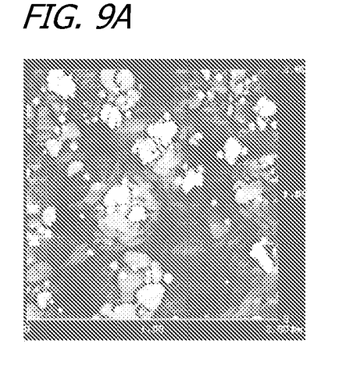
FIG. 9A is a photomicrograph of the surface of an InGaN layer in an implementation having the $NH_3$ flow rate be 20 slm in Comparative Example 2.
Figure 9B:
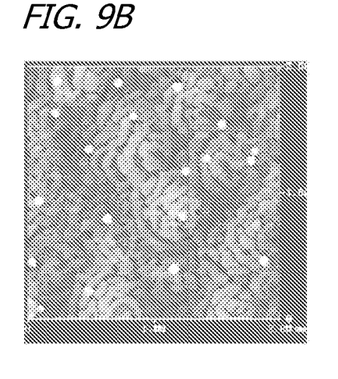
FIG. 9B is a photomicrograph of the surface of an InGaN layer in an implementation having the $NH_3$ flow rate be 30 slm in Comparative Example 2.
Figure 10A:
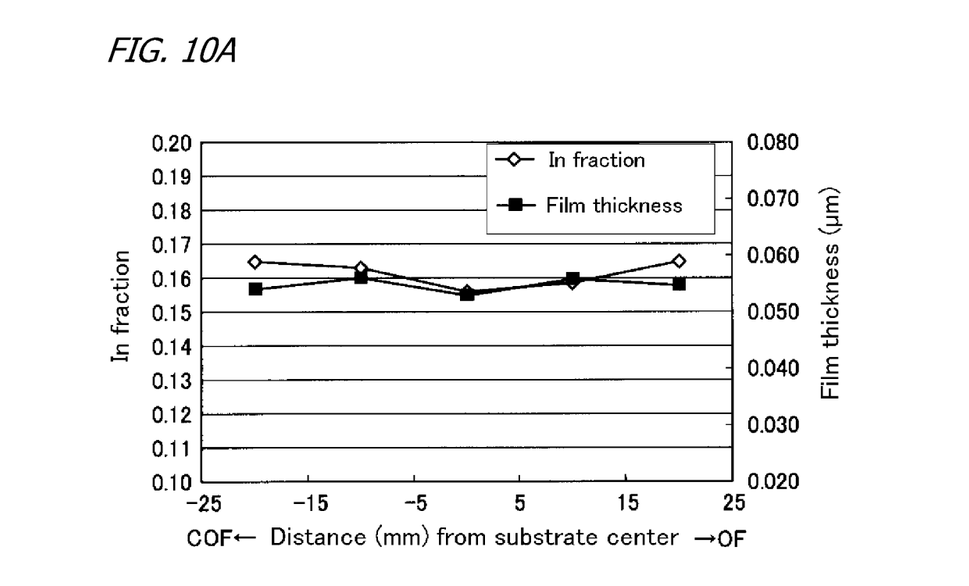
FIG. 10A is a graph plotting In-component distribution and film-thickness distribution in an implementation having the $NH_3$ flow rate be 20 slm in Comparative Example 2.
Figure 10B:
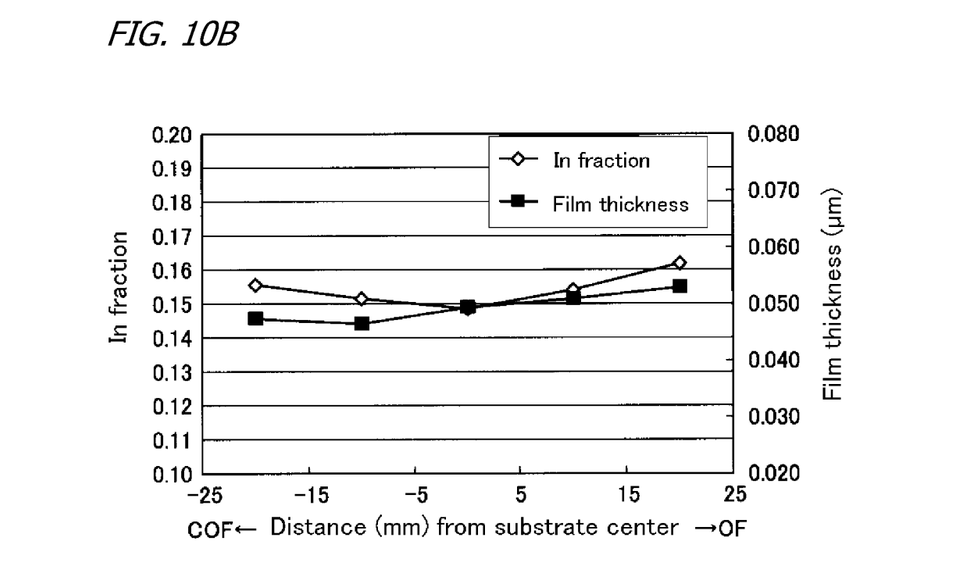
FIG. 10B is a graph plotting In-component distribution and film-thickness distribution in an implementation having the $NH_3$ flow rate be 30 slm in Comparative Example 2.

FIG. 9A is a photomicrograph of the surface of an InGaN layer in the implementation in which in Comparative Example 2, the $NH_3$ flow rate was brought to 20 slm, and FIG. 9B is a photomicrograph of the surface of an InGaN layer in the implementation in which in Comparative example 2, the $NH_3$ flow rate was brought to 30 slm. Furthermore, FIG. 10A is a graph showing In fraction distribution and film thickness distribution in the implementation in which in Comparative Example 2, the $NH_3$ flow rate was brought to 20 slm, and FIG. 10B is a graph showing In fraction distribution and film thickness distribution in the implementation in which in Comparative Example 2, the $NH_3$ flow rate was brought to 30 slm. It should be understood that in FIG. 9, bright regions represent the (step) regions in which height of the surface is high, and dark regions represent the (recess) regions in which height of the surface is low. Moreover, the results in FIG. 10 demonstrate distribution in one substrate.

Referring to FIG. 9, a lot of defects in the form of a step are present on the surface of the InGaN layer in the implementation in which the $NH_3$ flow rate was brought to 20 slm. On the other hand, in the implementation in which the $NH_3$ flow rate was brought to 30 slm, atomic steps are clearly observed on the surface of the InGaN layer, and only few defects are present. From the results, it is apparent that increasing $NH_3$ flow rate improves condition of InGaN layer surface.

The reason is believed to be as follows. Because $NH_3$ is relatively stable, the percentage in which $NH_3$ is changed into intermediate reactants ($NH_2$ ions or NH ions) is low, even if the $NH_3$ is heated. Therefore, raising $NH_3$ flow rate increases the amount of intermediate reactants, leading to an increase in reaction amount between intermediate reactants of III element-containing organometallic gas and intermediate reactant of $NH_3$. As a result, condition of InGaN layer surface is improved.

On the other hand, referring to FIG. 10, in the InGaN layer in the implementation in which the $NH_3$ flow rate was brought to 20 sml, the layer thicknesses and In fractions in the substrates are made relatively uniform, while in the InGaN layer in the implementation in which the $NH_3$ flow rate was brought to 30 slm, the layer thicknesses and In fractions in the substrates are worsened. Presumably, this is because increasing the $NH_3$ flow rate prevents the III element-containing organometallic gas from diffusing in the $NH_3$ gas.

Figure 11A:
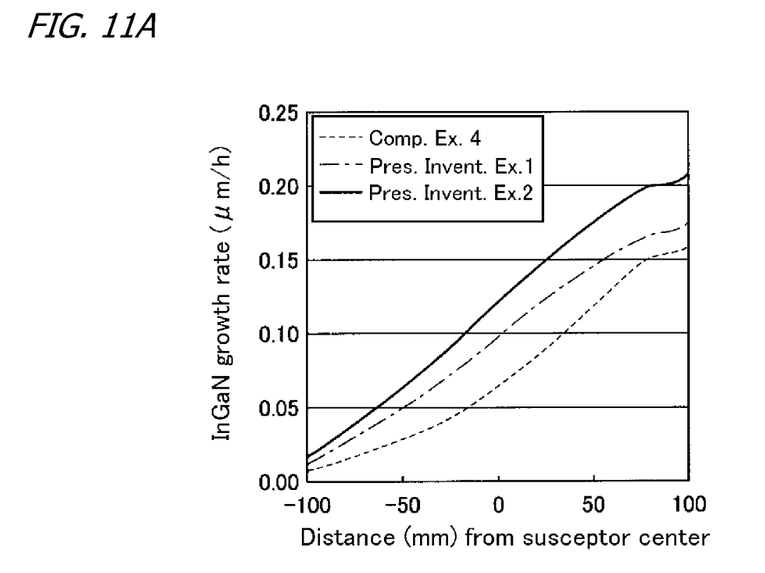
FIG. 11A is a graph plotting how InGaN growth rate varies depending on distance from the susceptor center.
Figure 11B:
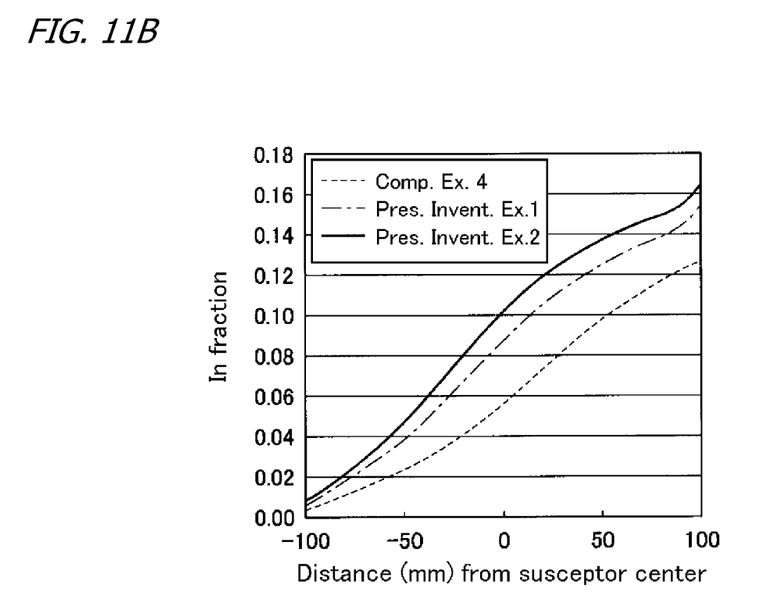
FIG. 11B is a graph plotting how In fraction varies depending on distance from the susceptor center.

Next, the inventors of the present invention prepared an MOCVD reactor, illustrated in FIG. 1, in which the heights t4, t5 and t6 were brought respectively to 12 mm, to 10 mm, and to 8 mm, and defined the reactor as a Present Invention Example 1. The inventors also prepared an MOCVD reactor, illustrated in FIG. 1, in which the heights t4, t5, and t6 were brought respectively to 12 mm, to 9 mm, and to 7 mm, and defined the reactor as Present Invention Example 2. In addition, the inventors prepared an MOCVD reactor having a duct W2, illustrated in FIG. 5, in which the heights t4 and t6 were brought respectively to 12 mm and to 8 mm, and defined the reactor as Comparative Example 4. Subsequently, with the $NH_3$ flow rate being brought to 30 slm, each of the MOCVD reactors of the Present Invention Examples 1 and 2, and of Comparative Example 4 was employed to deposit an InGaN layer onto the surfaces of substrates without rotating the susceptor 5. And then, relationships between interval from the center of the susceptor 5, and InGaN growth rate and In fraction were checked. The results are set forth in FIG. 11. FIG. 11A is a graph showing InGaN deposition rate distribution in the susceptor, and FIG. 11B is a graph showing In fraction distribution in susceptor. It should be understood that the horizontal axis of the graph in FIG. 11 is represented with an interval from the center of the susceptor along the central line (line C in FIG. 2) in the susceptor widthwise direction. Positive numbers mean the downstream side, and minus numbers mean upstream side.

Referring to FIG. 11, in Comparative Example 4, InGaN growth rate and In fraction gradient lower in the range from −100 mm to 0 mm, present in the upstream part in the reaction gas flow direction. Such a deposition-rate distribution and In fraction distribution prevent uniform deposition-rate and In fraction distributions from being obtained in the situation in which susceptor is rotated. On the contrary, in Present Invention Examples 1 and 2, InGaN growth rate and In fraction gradient heighten in the range in the upstream part in the reaction gas flow direction, relative to those in Comparative Example 4. As a result, the InGaN growth rate and In fraction become closer to linear proportion. Presumably, this is because in Present Invention Examples 1 and 2, the monotonic decrease of path height, downstream from a point on the side upstream from the upstream end of the location in which substrates are carried makes the III element-containing organometallic gas likely to diffuse into the $NH_3$ gas.

Next, with the $NH_3$ flow rate being brought to 30 slm, employing the MOCVD reactors of Present Invention Examples 1 and 2, and of Comparative Example 4, the susceptor 5 was rotated, and meanwhile an InGaN layer was deposited onto the surface of each of the six substrates 20 carried on the susceptor 5. Subsequently, in the substrates 20, InGaN layer thickness distribution width and In fraction distribution width were checked. The results are set forth in FIG. 3.

TABLE III

|  | Pres. Invent. Ex. 1 | Pres. Invent. Ex. 2 | Comp. Ex. 4 |
| --- | --- | --- | --- |
| InGaN layer film-thickness distribution spread | ±0.1% | ±0.6% | ±9.0% |
| In-fraction distribution spread | ±3.4% | ±5.5% | ±4.0% |

Referring to Table III, InGaN layer thickness distribution in Comparative Example 4 has a width of ±9.0%, while InGaN layer thickness distribution in Present Invention Example 1 has a width of +0.1%, and InGaN layer thickness distribution in Present Invention Example 2 has a width of ±0.6%. From these results, it is apparent that monotonically decreasing path height downstream from a point on the side upstream from the upstream end of the location in which substrates are carried enables uniformizing deposited films in thickness. Furthermore, the In fraction distribution in Comparative Example 4 has a width of ±4.0%, while In fraction distribution in Present Invention Example 1 has a width of ±3.4%, and In fraction distribution in Present Invention Example 2 has a width of ±5.5%. From these facts it is evident that even if the duct height is monotonically diminished downstream from a point on the side upstream from the upstream end of the location in which substrates are carried, there is only slight influence on the In fraction distribution.

According to the above results, in accordance with an MOCVD reactor 1 of the present embodiment, because the height of the duct 11 monotonically diminishes in the course upstream of Point A4, mixing of Gas G2 passing through Channel 11b and Gas G3 passing through Channel 11c is promoted at Point A4. As a result, the growth rate in the course upstream of Point P3 can be increased. This makes it possible to bring the relationship between the growth rate and the carrying-surface position along the direction in which the reaction gas G flows close to linear. As a consequence, by rotating the susceptor 5 the thickness of InGaN films deposited onto the substrates 20 can be uniformized. Furthermore, inasmuch as it is not necessary to make the reaction-gas reaction conditions on the upstream end of the susceptor 5 consistent with those on the downstream end, the heating member can be scaled up to improve the film-deposition efficiency.

Moreover, because Point P2 lies on the side upstream from Point A4, height of the duct 11 is held constant from Point A4 to Point P3, and thus flow of the reaction gas G over the substrates 20 can be brought close to laminar flow.

Furthermore, because Point P2 lies on the side upstream from Point A3, height of the duct 11 is held constant at least from Point A3 to Point P3, and thus flow of the reaction gas G can be brought close to laminar flow before the reaction gas G reaches the carrying surface.

Additionally, because Point P1 lies on the side downstream from Point A1, mixing of the gas G2 and the gas G3 can be prompted after the gases G2 and G3 join together.

Embodiment 2

Figure 12:
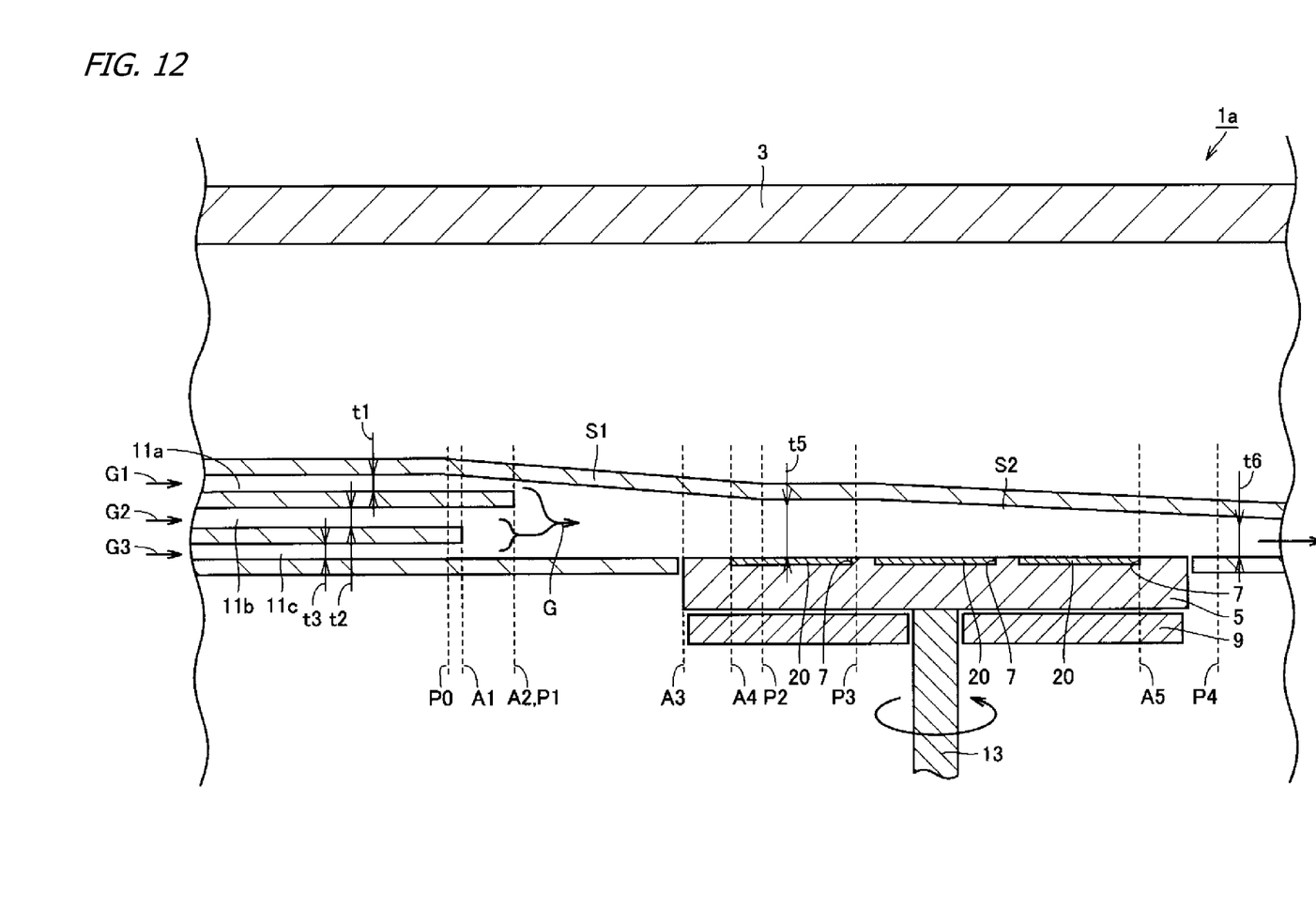
FIG. 12 is a sectional view illustrating the configuration of an MOCVD reactor in Embodiment 2 of the present invention.
Figure 13:
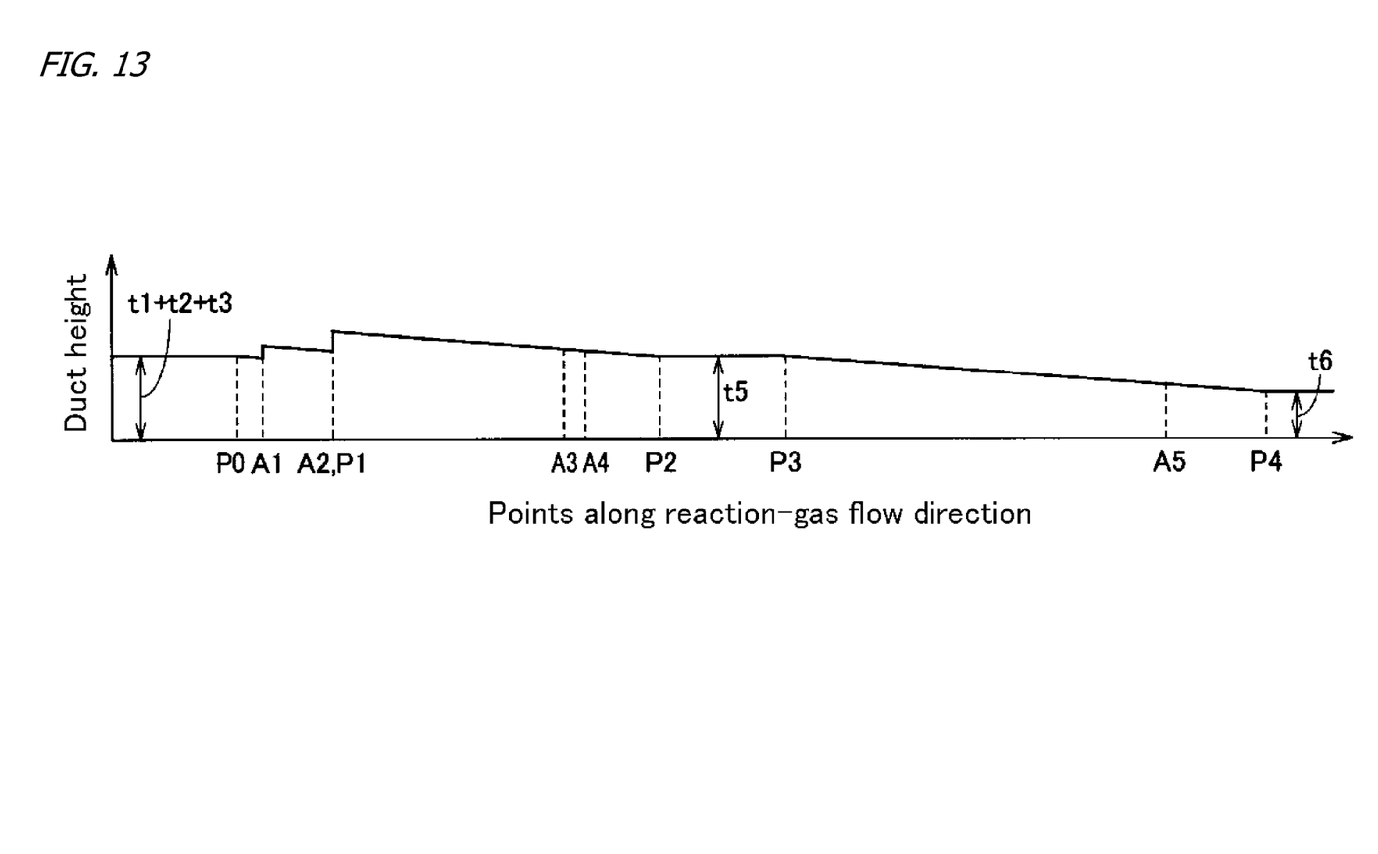
FIG. 13 is a chart diagramming duct height in relation to points along the direction of reaction gas flow, in Embodiment 2 of the present invention.

FIG. 12 is a cross-sectional view of a configuration of an MOCVD reactor in Embodiment 2 of the present invention. FIG. 13 is a diagram representing relationship between points along the direction of reaction gas flow and path height, in Embodiment 2 of the present invention. Referring to FIGS. 12 and 13, an MOCVD reactor 1a in the present embodiment differs in form of a duct 11 from the MOCVD reactor illustrated in FIG. 1. Specifically, a sloping portion S1 is formed between Point P0 on the side upstream from Point A1 and Point P2. Therefore, height of the duct 11 along the direction of the flow of a reaction gas G monotonically (linearly) decreases downstream from Point A2 to Point P2. In such a form of the duct 11, Point P1 and point A2 are the same position. Furthermore, Point P2 lies on the side downstream from Point A4, and Point P4 lies on the side downstream from Point A5. The point P2 may lie at the same position as Point A4.

It should be understood that other configurations are the same as in the MOCVD reactor, illustrated in FIG. 1, of Embodiment 1, and the identical parts have been labeled with the same reference mark, and reduplicating description will be omitted.

The MOVCD reactor of the present embodiment provides the same advantages as the MOCVD reactor in Embodiment 1.

In addition, because Point P4 lies at the same position as Point A5, or on the side downstream from Point A5, relationship between the location in which the substrates 20 are carried, along the direction in which the reaction gas G flows and the reaction rate of the reaction gas G, can be brought to linear proportion.

It should be understood that the configuration of the MOCVD reactor in the present embodiment and the configuration of the MOCVD reactor illustrated in FIG. 1 may be combined as appropriate.

Furthermore, although in Embodiments 1 and 2, examples in which InGaN layers are deposited has been given, the MOCVD reactor of the present invention is applicable to deposition of layers apart from InGaN layer. The number of channels is not limited to three, so any number of two or more may be adopted.

The embodiments disclosed in the foregoing should in all respects be considered to be illustrative and not limiting. The scope of the present invention is set forth not by the foregoing embodiments but by the scope of the patent claims, and is intended to include meanings equivalent to the scope of the patent claims and all revisions and modifications within the scope.

The present invention is especially suited to metalorganic chemical vapor deposition reactors for producing nitride semiconductor layers.

What is claimed is:

1. A metalorganic chemical vapor deposition reactor for depositing a film onto substrates, employing a reaction gas, the metalorganic chemical vapor deposition reactor comprising:

a rotatable heating member having a carrying surface for carrying a plurality of the substrates and heating the substrates, the carrying-surface areas where the heating member carries substrates defining a substrate-carrying locus whose perimeter lies on the carrying-surface areas' outer edges; and a duct for conducting the reaction gas to the substrates; wherein the carrying surface of said heating member fronts on the interior of said duct;

said duct has a first channel and a second channel, and the first channel and the second channel merge in an end of said duct upstream of the upstream edge of the carrying surface;

the height of said duct along the direction of the reaction gas flow monotonically diminishes heading downstream from a first point to a second point, stays constant from the second point to a third point, from the third point immediately diminishes and monotonically continues to diminish heading downstream from the third point, and becomes constant from a fourth point; and the first point lies upstream of the upstream edge of the perimeter of the substrate-carrying locus on the heating-member carrying surface, the third point lies on a line normal to and passing through said heating member and within the perimeter of the substrate-carrying locus, and the fourth point lies at the downstream edge of the perimeter of the substrate-carrying locus, or downstream of said downstream edge; whereby flow of the reaction gas over the substrates is close to a laminar flow.

2. A metalorganic chemical vapor deposition reactor as set forth in claim 1, wherein the second point lies upstream of the upstream edge of the locus of where the substrates are carried.

3. A metalorganic chemical vapor deposition reactor as set forth in claim 2, wherein the second point lies upstream of the upstream edge of the carrying surface itself.

4. A metalorganic chemical vapor deposition reactor as set forth in claim 3, wherein the first point lies downstream of the location where the first channel and the second channel merge.

5. A metalorganic chemical vapor deposition reactor as set forth in claim 3, wherein said duct has a first sloping portion formed between the first point and the second point, and a second sloping portion formed heading downstream from the third point, and the first and second sloping portions decline in the direction of the reaction gas flow.

6. A metalorganic chemical vapor deposition reactor as set forth in claim 2, wherein the first point lies downstream of the location where the first channel and the second channel merge.

7. A metalorganic chemical vapor deposition reactor as set forth in claim 2, wherein said duct has a first sloping portion formed between the first point and the second point, and a second sloping portion formed heading downstream from the third point, and the first and second sloping portions decline in the direction of the reaction gas flow.

8. A metalorganic chemical vapor deposition reactor as set forth in claim 1, wherein the first point lies downstream of the location where the first channel and the second channel merge.

9. A metalorganic chemical vapor deposition reactor as set forth in claim 1, wherein said duct has a first sloping portion formed between the first point and the second point, and a second sloping portion formed heading downstream from the third point, and the first and second sloping portions decline in the direction of the reaction gas flow.

\* \* \* \* \*